United States Patent

Sato et al.

[11] Patent Number: 5,997,958
[45] Date of Patent: Dec. 7, 1999

[54] METHOD OF DEPOSITING NANOMETER SCALE PARTICLES

[75] Inventors: Toshihiko Sato; Haroon Ahmed, both of Cambridge, United Kingdom

[73] Assignee: Hitachi Europe Limited, Maidenhead, United Kingdom

[21] Appl. No.: 09/038,939

[22] Filed: Mar. 12, 1998

[30] Foreign Application Priority Data

Mar. 13, 1997 [EP] European Pat. Off. ............. 97301689

[51] Int. Cl.[6] .............................. B05D 1/32; B05D 3/10; B05D 5/12
[52] U.S. Cl. ........................ 427/468; 427/472; 427/125; 427/180; 427/282; 427/337; 438/763
[58] Field of Search ................... 427/180, 191, 427/466, 468, 469, 472, 475, 125, 126.3, 337, 343, 282; 438/763

[56] References Cited

U.S. PATENT DOCUMENTS 5,110,618  5/1992  Faust .

FOREIGN PATENT DOCUMENTS

WO93/10564  5/1993  WIPO .
WO96/21952  7/1996  WIPO .

OTHER PUBLICATIONS

Science, vol. 273, Sep. 20, 1996, Lancaster, PA, US, pp. 1690–1693: Self–assembly of a two–dimensional superlattice of molecularly linked metal clusters.

Appl. Phys. Lett. 68 (18) Apr. 29, 1996, New York, US, pp. 2574–2576: An approach to electrical studies of single nanocrystals.

Japanese Journal of Applied Physics, vol. 34, No. 34–1, Jan. 1, 1994, pp. 158–160, J. Takada: Size Effects of Molecular Excitons in Organic–Inorganic Hetero Nanostructures.

Physical Review B, vol. 48, No. 23, Dec. 15, 1993, Macucci et al.: Electronic energy spectrum and the concept of capacitance in quantum dots.

D.A. Handley: *Colloidal Gold: Principles, Methods, and Applications*, vol. 1, 1989, Academic Press, Inc., New York, p. 13.

Vrancken et al.: *The Physisorption and Condensation of Aminosilanes on Silica Gel*, pp. 46–57, The Royal Society of Chemistry, Cambridge, 1994.

Journal of Colloid and Interface Science 21, 569–594 (1966), R.K. Iler: *Multilayers of Colloidal Particles*.

Langmuir, vol. 11, 1995, pp. 1313–1317, Doran et al.: Organization of Au Colloids as Monolayer Films onto ITO Glass Surfaces: Application of the Metal Colloid Films as Base Interfaces To Contruct Redox–Active Monolayers.

Colloid Polym Sci (1995) vol. 273, pp. 101–117, G. Schön et al.: A fascinating new field in colloid science:small ligand–stablilized metal clusters and possible application in microelectronics.

Appl. Phys. Lett. 66 (24), Jun. 12, 1995, Chen et al.: Coulomb blockade at 77 K in nanoscale metallic islands in a laterial nanostructure.

Devoret & Grabert: *Single Charge Tunneling*, Plenum Press, New York, 1992, pp. 1–3.

*Primary Examiner*—Fred J. Parker
*Attorney, Agent, or Firm*—Kenyon & Kenyon

[57] ABSTRACT

Nanometre scale particles (3) e.g. of Au are deposited on a Si substrate (2) with a $SiO_2$ surface layer (1) provided with receptor sites (4) of a first electrical polarity by treatment with APTMS solution. The Au particles (3) have a surface charge (5) of a second opposite polarity e.g from surface adsorbed citrate ions, such that they are attracted to the surface sites on the substrate. The deposited Au particles are then released from the surface sites such that the particles move over the substrate and coalesce into a low dimensional aggregated structure. The aggregated structure may form at a surface irregularity on the surface of the substrate. The structure may be used in a quantum electronic device such as a single electron transistor.

27 Claims, 6 Drawing Sheets

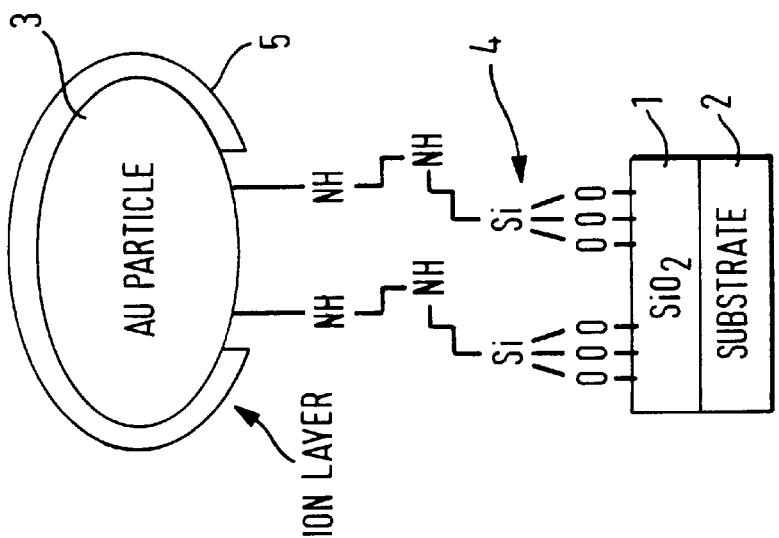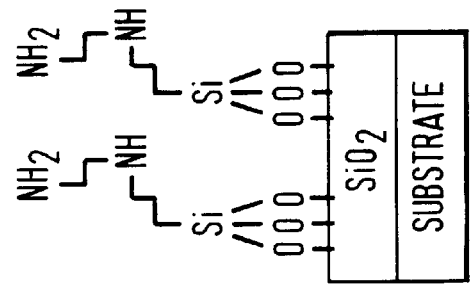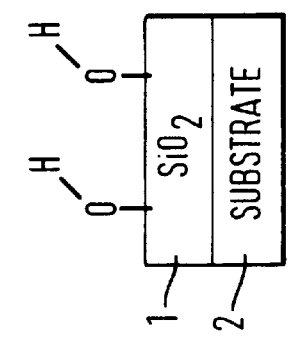

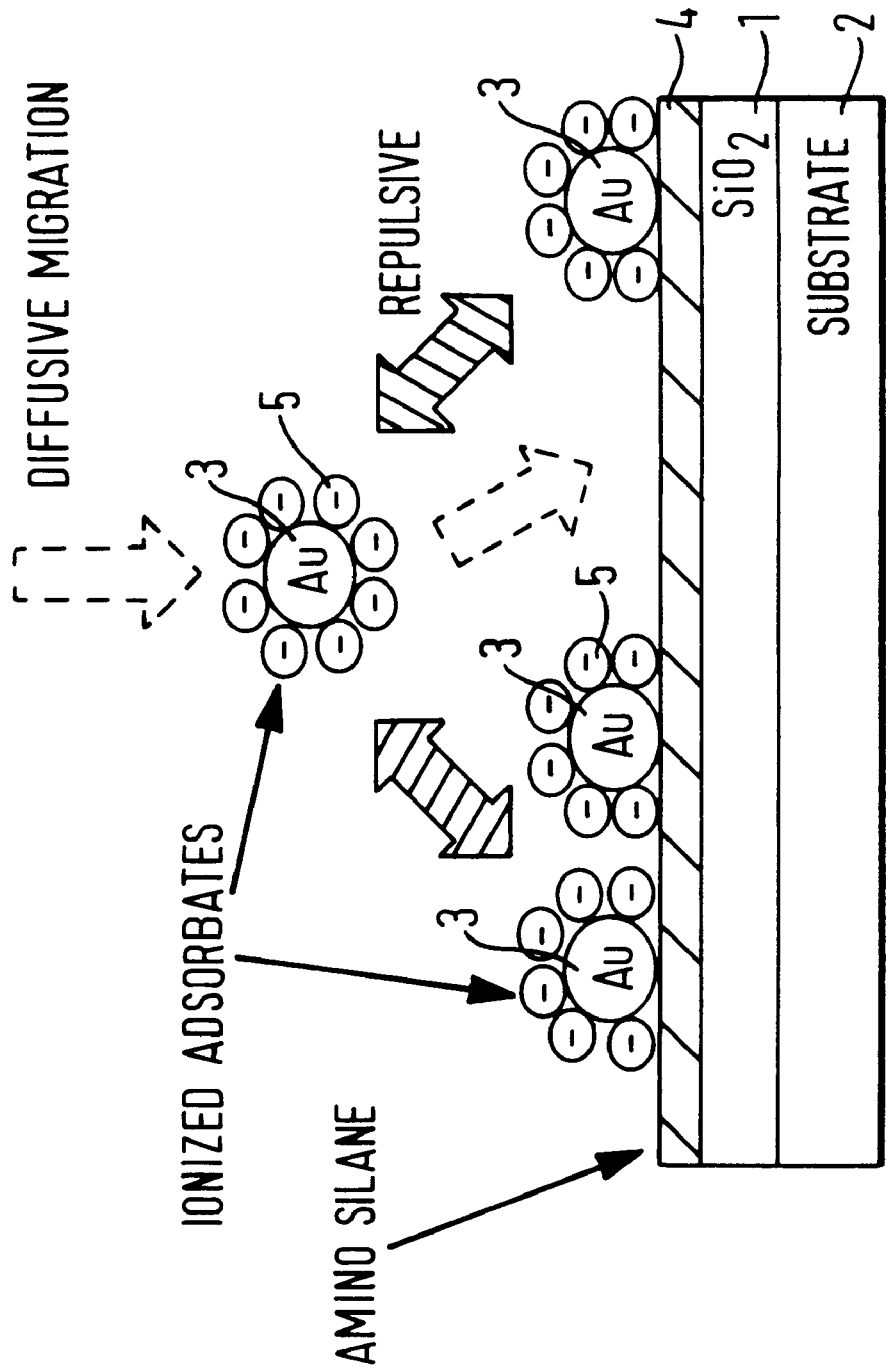

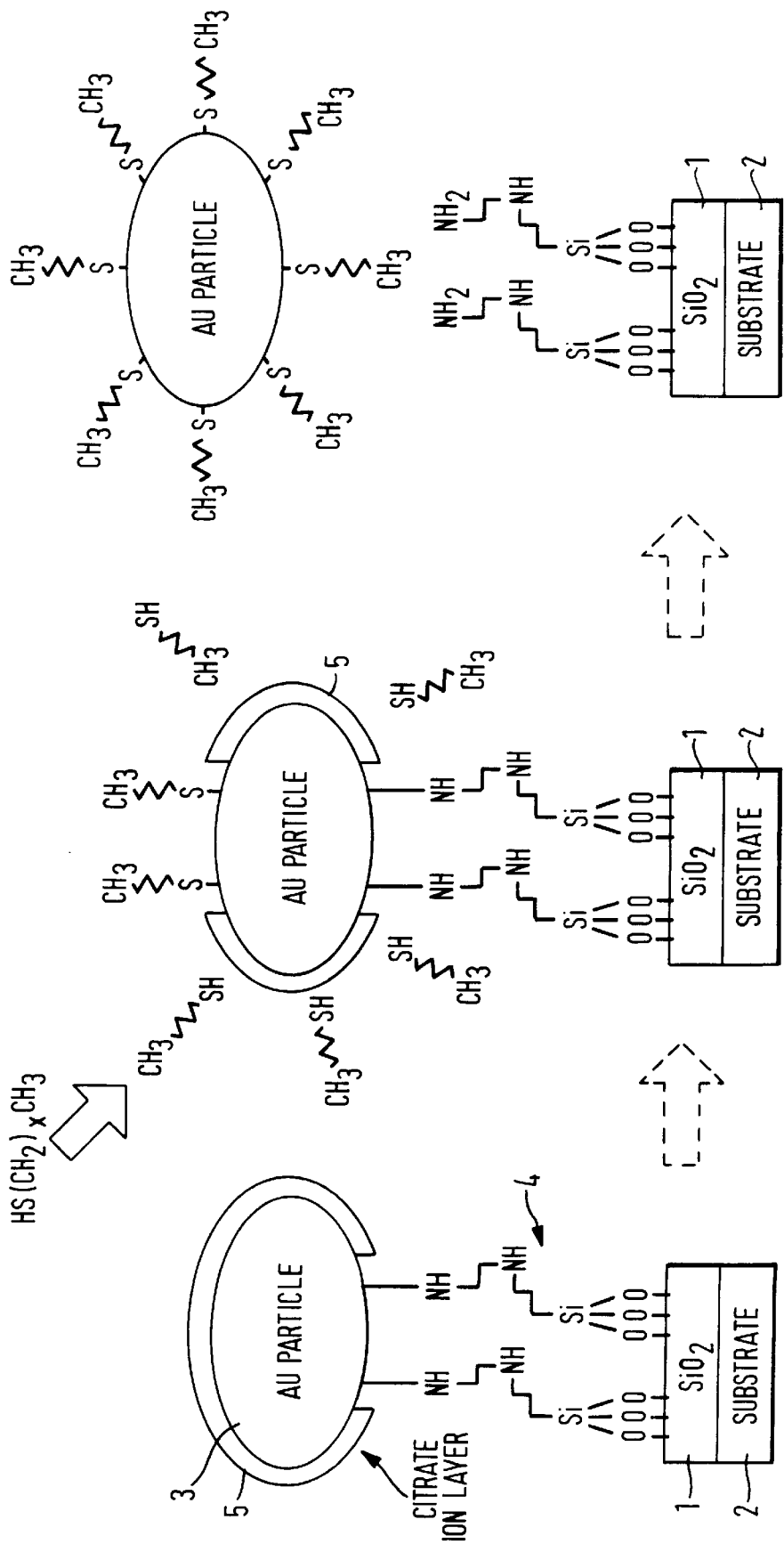

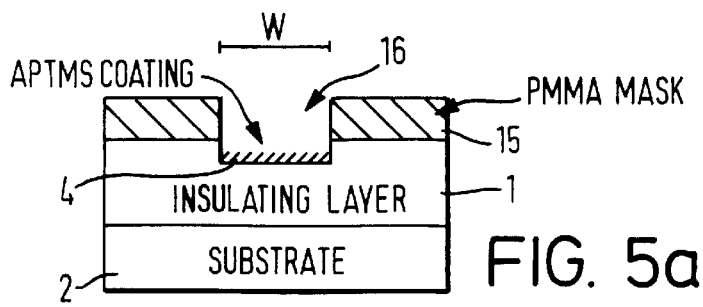
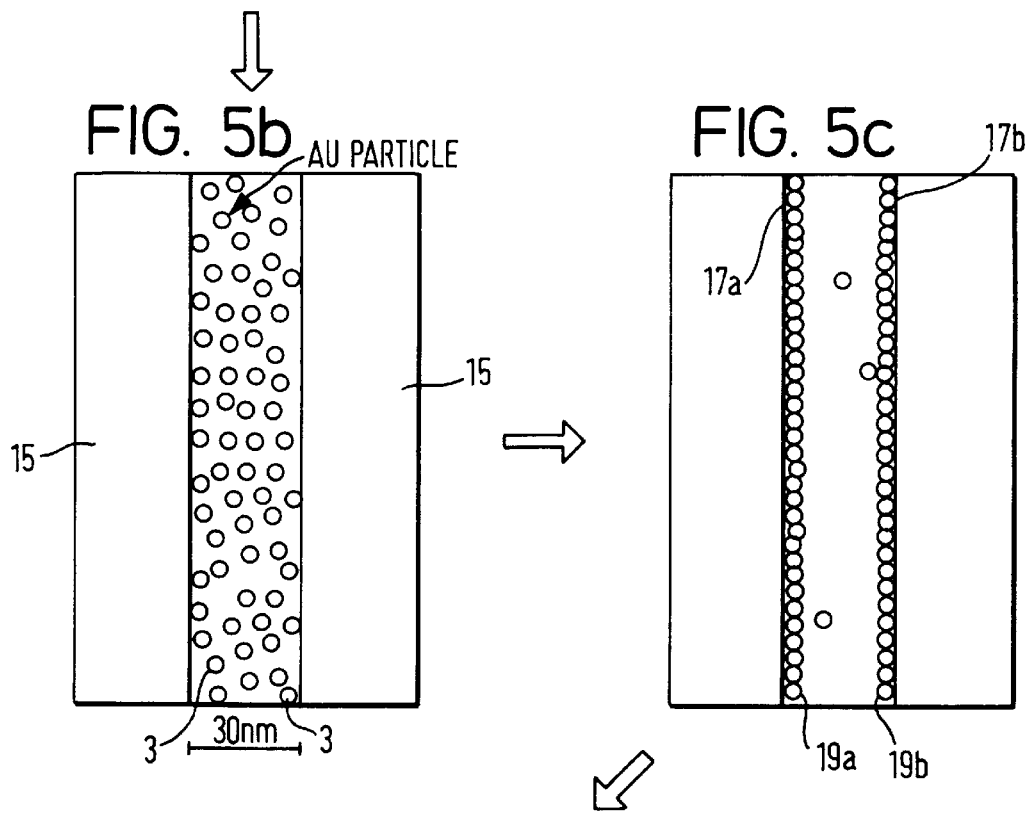
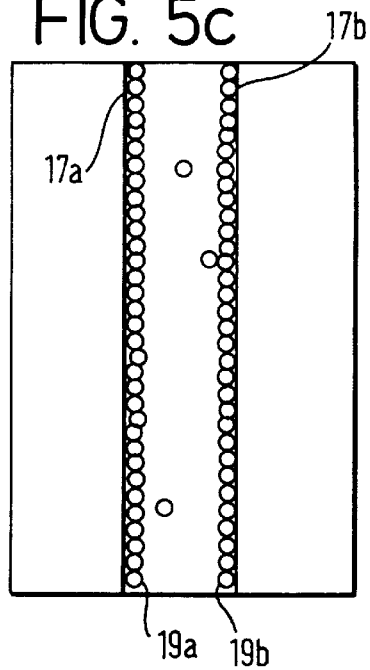
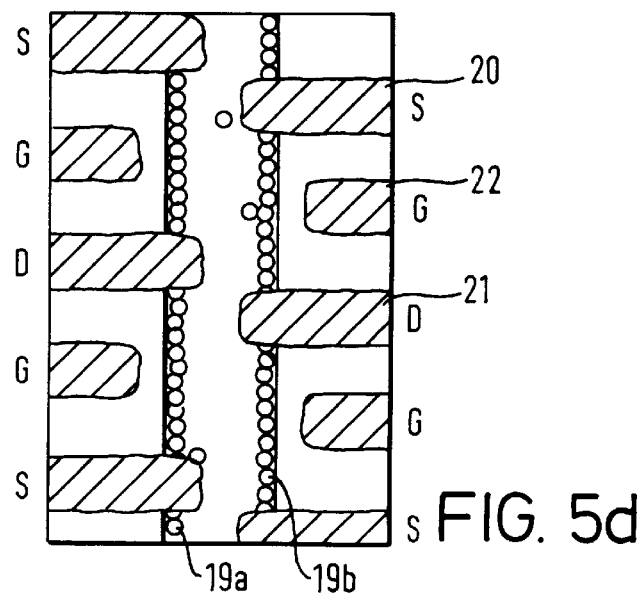

METHOD OF DEPOSITING NANOMETER SCALE PARTICLES

FIELD OF THE INVENTION

This invention relates to a method of depositing nanometre scale particles on a substrate and has particular but not exclusive application to the fabrication of quantum electronic devices such as single electron transistors and memory devices.

BACKGROUND OF THE INVENTION

Quantum electronic devices which manipulate the flow of individual electrons, are known and reference is directed to W. Chen, H. Ahmed and K. Nakazato, Appl. Phys. Lett. vol. 66, 3383 (1995). These prior devices make use of so-called quantum dots which are conductive islands, constructed on the nanometre scale which exhibit Coulomb blockade to single electron tunnelling. According to this effect, the charging energy of the island is greater than the surrounding thermal energy, so that once charged by the entry of a single electron, no further electrons can enter the dot until an electron leaves. Quantum electronics devices use this effect to manipulate single electrons entering and leaving a quantum dot, and typically consist of a metal or semiconductor quantum dot in which electrons are localised, dielectric tunneling barriers through which single electrons enter or leave, and electrodes which either electrostatically bias the dot or supply electrons to the dot through the barriers.

A general discussion of the Coulomb blockade effect for such a system is given in Hermann Grabert and Michel H. Devoret, "Single Charge Tunneling" (Plenum Press, New York, 1992) pp. 1–3. From this, it will be understood that there are two basic requirements for realising the Coulomb blockade effect in a single electron device, as follows:

$$E_c = e^2/2C \gg kT, \quad (1)$$

$$R_T \gg R_K = h/e^2 \quad (2)$$

where T is the device operation temperature, $R_T$ is a tunneling resistance, $R_K = h/e^2$ is the resistance quantum, and $E_c = e^2/2C$ is the energy required to place an electron at a localised electronic state in the dot. Here, the capacitance C is defined as a constant that relates the energy of the localised state and its spatial extent i.e. the geometrical shape of the charge distribution. The capacitance C is easily defined in the case of metal clusters, and is also definable in the case of semiconductor quantum dots. Reference is directed to M. Macucci, Karl Hess and G. J. Iafrate, "Electronic Energy Spectrum and the Concept of Capacitance in Quantum Dots", Phys., Rev. B, vol. 48, p. 17354 (1993).

It is desirable that a practical single electron device be operable at room temperature i.e. with T=300° K. This implies from criterion (1) listed above that the capacitance C should be very small, namely $C \gg 3 \times 10^{-18}$ F.

The capacitance C can be designated as the sum of two different capacitances, as follows:

$$C = C_S + C_e$$

where $C_S$ is known as the self-capacitance and is constituted by the capacitance between the island and infinity. $C_e$ is the capacitance between the dot and the surrounding electrodes of the device. When the dot diameter becomes smaller than 10 nm, the self-capacitance $C_S$ mainly determines the total capacitance C as it is much larger than the other capacitances $C_e$. Therefore, in order to ensure room temperature operation, the dot size should be reduced below 10 nm. However, devices with a dot size of less than 10 nm cannot be fabricated readily using conventional electron beam lithography as this is smaller than the state of the art techniques can readily achieve.

It is known that nanometre scale particles can be prepared chemically, with diameters of less than 10 nm, such as colloidal particles and molecular clusters. For example, gold colloidal particles in citrate gold sols have been prepared in a size range from 2 nm to 100 nm. Reference is directed to N. Uyeda, M. Nishino, and E. Suito, J. Colloidal and Interface Science, vol. 43, p. 181 (1973). Also, ligand-stabilised $Au_{55}$ clusters with a gold metal core size of 1.4 nm have been reported—see G. Schön and U. Simon, Colloid Plym. Sci., vol. 273, pp. 101–127 and pp. 202–218 (1995). One of the significant features of these materials is their well defined particle size distribution. In the case of non-dispersed colloidal Au particles as reported by Uyeda et al supra, the size distribution has a 10% standard deviation. In the case of molecular clusters, the size distribution is determined at an atomic-scale accuracy. The average diameters of these nano-scale particles are determined by the parameters of the chemical reactions that form the particles, such as the volume ratios of starting material solutions. The particle formation reactions proceed spontaneously according to the macroscopic reaction parameters and they are free of the size limitations that arise in conventional lithographic quantum dot fabrication.

A method of coating colloidal particles on metallic oxide surfaces has been known since the 1960's and reference is directed to R. K. Iller, Journal of Colloid and Interface Science, vol. 21, pp 569–594 (1966). Also, Au particle deposition on a metal oxide surface using a silane coupler was reported by A. Doron, E. Katz and I. Willmer, Langmur, vol. 11, pp 1313–1317 (1995). However, a problem with this technique was that particle coagulation occurred.

The application of cluster chemistry to single electron device fabrication is described in D. L. Klein, P. L. McEuen, J. E. B. Katari, R. Roth & A. P. Alivisatos, Pll. Phys. Lett. 68, 2574 (1996). A nanometre scale gold particle ligated alkane chains was used as a tunnel barrier. The particle was captured in a lithographically defined 5-nm gap between metal electrodes on a substrate, with limited reproducibility. This approach required complex lithographic techniques and did not use the self assembly techniques that can be achieved with cluster chemistry.

In copending EP- A-0788149 filed on Feb. 5th 1996 there is described a method of depositing nanometre scale gold particles onto a substrate in a monolayer with a controlled inter-particle spacing, suitable for use in quantum effect electronic devices. In our copending EP 96308283.9 filed on Nov. 15, 1996 and corresponding U.S. Ser. No. 08/958845 filed on Oct. 28th 1997, treating the monolayer of gold particles with an ethanolic solution of dithiol is described, to allow further overlying monolayers of the gold particles to be deposited. However, for some devices, it would be desirable to assemble nanometre scale particles in more closely packed structures such as wires, and to simplify the electrical connection of the particulate structure to other features of the device.

SUMMARY OF THE INVENTION

The present invention provides a method in which the particles of an individual layer are released from the substrate so that they can move and coalesce into a more closely packed aggregate structure.

According to the invention there is provided a method of depositing nanometre scale particles on a substrate, comprising providing receptor sites of a first electrical polarity on a surface of the substrate, providing the particles with a surface charge of a second opposite polarity such that they are attracted to the surface sites on the substrate, and releasing the particles from the surface sites such that the particles move over the substrate and coalesce into an aggregated structure.

The aggregated structure can be caused to coalesce at a desired location by providing a surface irregularity in the substrate so that the particles aggregate at the irregularity. The irregularity may be produced using a mask pattern, which defines a region on the substrate that includes the receptor sites, with the edge of the mask pattern providing the irregularity. The mask pattern may define an elongate trench with a width of at least 10 times greater than the mean diameter of the particles.

The particles may be released from the substrate by treating them with a fluid which may include a composition that bonds to the surface of the particles so as to break the bonding with the surface. The composition may comprise an alkane thiol. The composition may chemically bond together adjacent particles in the aggregated structure, for example an alkane dithiol. The composition may be applied to the substrate in an ethanolic solution.

The particles may include surface adsorbed ions of the second polarity e.g. citrate ions.

The particles may be formed of a metal or an oxide thereof, for example Au, although other materials may be used, for example Ag, Pd, Pt, Ti, Cu, Cd, Hg, Al or Ni, or $SiO_2$, $Al_2O_3$, NiO or $TiO_2$.

The particles may have a mean diameter of 10 nm or less.

In order to adhere the particles to the substrate, its surface may be treated with a coupling agent to provide receptor sites. For example where the substrate is of silicon, with $SiO_2$ layer, it may be treated with an organo-silane, such as an amino functional silane, to provide the receptor sites.

The method may be used to form quantum electronic devices which may be operable at room temperature. Electrodes may be formed on the substrate electrically coupled to the aggregated structure in order to control electron transport. The resulting device may be used for example, as a single electron transistor in which electron transport is determined by Coulomb blockade to single electron tunnelling along the aggregated structure of the particles.

BRIEF DESCRIPTION OF THE DRAWINGS

In order that the invention may be more fully understood, embodiments thereof will now be described by way of illustrative example with reference to the accompanying drawings in which:

FIG. 1a is a schematic sectional view of a $SiO_2$ substrate;

FIG. 1b is a sectional view of the substrate after having been treated with an organo-silane coupling agent;

FIG. 1c is a schematic sectional view of the particle deposition process;

FIG. 2 is a schematic sectional view illustrating deposition of the nanometre scale particles onto the substrate;

FIG. 3a illustrates molecular bonding between a deposited particle and the substrate;

FIG. 3b illustrates a replacement reaction that occurs when an alkane thiol is applied to the substrate;

FIG. 3c illustrates how the particle is released in response to the alkane thiol;

FIG. 5a is a cross sectional view of a substrate used to produce an electronic device in accordance with the invention;

FIG. 5b is a plan view of the device shown in FIG. 5a;

FIG. 5c corresponds to FIG. 5b after a replacement reaction in which deposited gold particles move to the edge of a mask pattern;

FIG. 5d illustrates electrodes applied to the device of FIG. 5c for use as a single electron transistor;

DETAILED DESCRIPTION

Figure 4A:
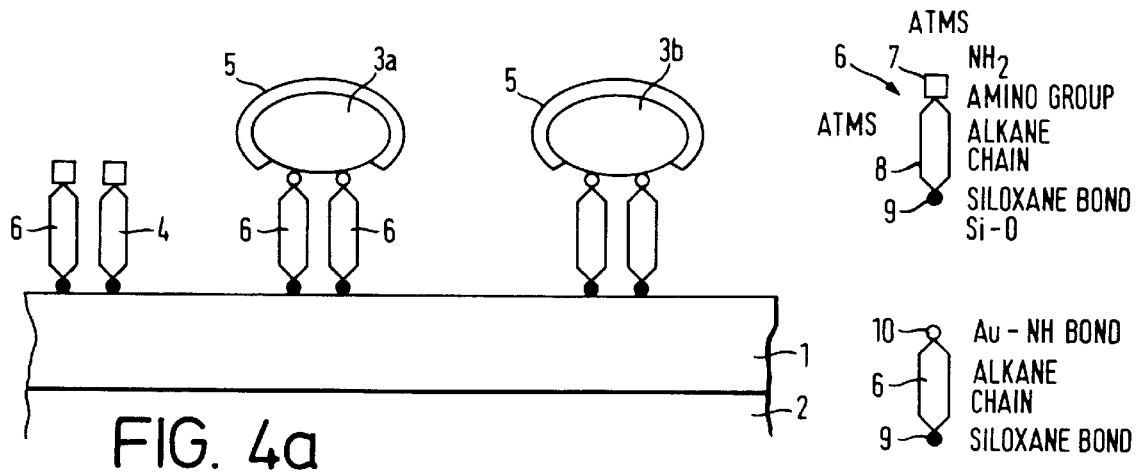
FIGS. 4a, b and c illustrate stages in the release of Au particles from the substrate during a replacement reaction using an alkane dithiol, and illustrates how adjacent particles initially bonded to the substrate (FIG. 4a) are released (FIG. 4b) and then bonded together (FIG. 4c)

In the example of the method according to the invention to be described, gold particles with a nominal diameter of 10 nm and a standard deviation in diameter of 1 nm (+/−10%) are deposited onto a 1-micron thick $SiO_2$ film 1 thermally grown on an Si crystal substrate 2 shown in FIG. 1.

The gold nano-scale particles can be prepared in a number of different ways. They can be produced as described in Uyeda et al supra by a precipitation method, by mixing a solution of $HAuCl.4H_2O$ and sodium citrate. The diameter of the nano-scale deposited particles is dependent upon the concentration of the two solutions. The mixing of the solutions is performed at room temperature. The resulting precipitate comprises nano-scale Au particles with surface adsorbed citrate ions. Colloidal suspensions of such particles can be purchased commercially, with predetermined mean particle sizes and diameter range distributions, from Nanoprobes Inc, 25E Loop Road Ste. 124, Stony Brook, N.Y. 11790-3350 USA. The particles are supplied in an aqueous suspension. The adsorbed citrate ions give a negative charge to the Au particles. In the example described hereinafter, the gold colloidal particle (GCP) citrate solution used, was prepared according to the recipe described in D. A. Handley, Colloidal Gold—Principles, Methods and Applications, edited by M. A. Hayat, Academic Press, New York, 1989 Vol. 1, p13.

Considering now the substrate shown in FIG. 1a, it is initially cleaned by brief (~30 sec) oxygen plasma ashing. The substrate is then immersed in a dilute aqueous solution of a coupling agent which, as will be described hereinafter, prepares the surface of the substrate so that the Au particles will attach themselves in a monolayer with uniform spacing. In this example, the coupling agent comprises an amino-functional silane. The substrate was immersed in a 2.3 mM aqueous solution of 3-(2-aminoethylamino)propyltrimethoxysilane (APTMS) for five minutes. Then, the substrate was removed from the solution, rinsed in two baths of distilled water, dried with a nitrogen gun and baked for 30 minutes at 120° C. in an oven.

The APTMS treated-substrate 1 was then immersed in the GCP solution for 8–12 hours, washed in two distilled water baths and dried with the nitrogen gun.

The adsorption mechanism of the silane coupling agent to the $SiO_2$ surface has been extensively studied and is described in K. C. Vrancken, P. Van Der Voort, K. Grobert, and E. F. Vansant, in Chemically Modified Surfaces, edited by J. J. Pesek, I. E. Leigh (The Royal Society of Chemistry, Cambridge, 1994) pp. 46–57. It is well known that the $SiO_2$ surface 1 is terminated by hydroxyl groups when exposed to the atmosphere, as is shown in FIG. 1a. The adsorbed hydroxyl group density is typically at the level of 5 molecules per $nm^2$. The amino-functional silane molecules of the coupling agent, replace the hydroxyl ions at these sites, as shown in FIG. 1b. The amino-functional silanes are hydrolysed in an aqueous solution and form hydrogen bonds with the surface 1, assisted by the water molecules. After this physisorption, direct condensation (chemisorption) of the silane takes place, due to the catalytic effect of the amino group, forming siloxane bonds with the substrate silicon. As a consequence, the APTMS molecules are oriented in a layer 4 with their free amino groups away from the substrate as shown in FIG. 1b. When the silane treated sample is immersed in the aqueous citrate GCP, the amino groups are protonated, giving a positive surface charge to the substrate as shown in FIG. 1c.

Negatively charged Au particles 3 from the GCP are attracted and deposited onto the positively charged substrate surface. The gold particles are immobilised on the surface 1 of the substrate 2 because the amino groups have a stronger affinity to the gold than the ionic citrate adsorbates. For further details, reference is directed to A. Doron et al, Langmuir 11, 1313 (1995) and K. C. Graber et al, J. Am. Chem. Soc. 118,1148 (1996). After being coated with a monolayer of Au particles 3, the charge on the $SiO_2$ surface 1 becomes neutralised which inhibits further layers of particles from becoming deposited on the surface. Thus, only a monolayer is formed.

As shown in FIG. 2, the negative surface charge 5 on the Au particles 3 causes adjacent particles to repel one another electrostatically and as a result, a regular inter-particle spacing is established in the monolayer. For further details, reference is directed to our EP- A-0788149 supra. Thus the deposition process self-terminates before a close packing density is achieved. Whilst this can be desirable in some instances, in other devices it would be desirable to have a closer packing density to achieve structures such as wires, and the present invention addresses this problem.

In accordance with the invention, the GCP monolayer, formed by the process just described with reference to FIGS. 1 and 2, is treated with a liquid surfactant that releases the deposited Au particles 3 from the substrate 2 so as to allow them to move, still substantially within a monolayer, so as to coalesce into an aggregated structure.

Referring to FIG. 3, an example is illustrated in which the deposited Au particles 3 are treated with an alkane thiol i.e. HS $(CH_2)_x CH_3$. This produces a replacement reaction. As shown in FIG. 3b, the molecule can replace the citrate ions absorbed into the Au colloidal particles 3. Also, the thiols can replace the bonds formed between an amino group of the APTMS layer 4 and the gold atoms of the particle 3 because of the stronger affinity of sulfur (in the alkane thiol) to gold. As a result, the Au particles 3 become surrounded by the thiol molecules which make the surfaces of the particles 3 inert.

As shown in FIG. 3c, a gold particle 3, which was previously immobile due to its linkage to the layer 4, is now released and can move over the surface of the substrate 2. The released gold particles thus move over the surface of the substrate seeking a location to be anchored. While the particles are moving on the surface, they are loosely held by the van der Waals force between the Au particles and the substrate. Consequently, they collide with one another and form a hexagonally packed, two-dimensional lattice on the substrate.

If the substrate surface includes an irregularity such as a step or a kink, the mobile Au particles on the surface are first trapped at the surface irregularity and then form self-organising patterns in a manner that is guided by the shape of the surface irregularity. Specific examples of devices formed in this way will be described later.

Referring now to FIG. 4, this illustrates the effect of using dithiol molecules as a surfactant for the Au particle monolayer, instead of an alkanethiol as previously described with reference to FIG. 3. When dithiol molecules i.e. HS $(CH_2)_x$ SH are used as the surfactant the Au particle monolayer is modified by a replacement reaction in a somewhat different way. In much the same way as for the previously described thiols, dithiols replace the APTMS bonds to the Au particles due to the stronger affinity of the sulfur atoms in the dithiol molecules, to the gold of the particles 3, than the bonding of the amino group, so that the Au particles 3 are released from the substrate giving them a surface mobility. In addition, the particles are bonded together.

Aryldithiol, di-isonitriles can be used as alternatives to the alkanedithiol.

Referring to FIG. 4a, two Au particles 3a,b are shown bonded to the $SiO_2$ layer 1 on the substrate 2. APTMS molecules 6 which make up the layer 4 consist of an amino group 7 at one end of an alkane chain 8, that is terminated at the other end by a siloxane bond 9 to the $SiO_2$ layer 1. As previously explained, the Au particles, when deposited in a monolayer, are received by molecules 6 of the APTMS layer 4 and the amino groups 7 form an Au-NH bond 10 so as to immobilise the Au particle on the substrate.

Figure 4B:
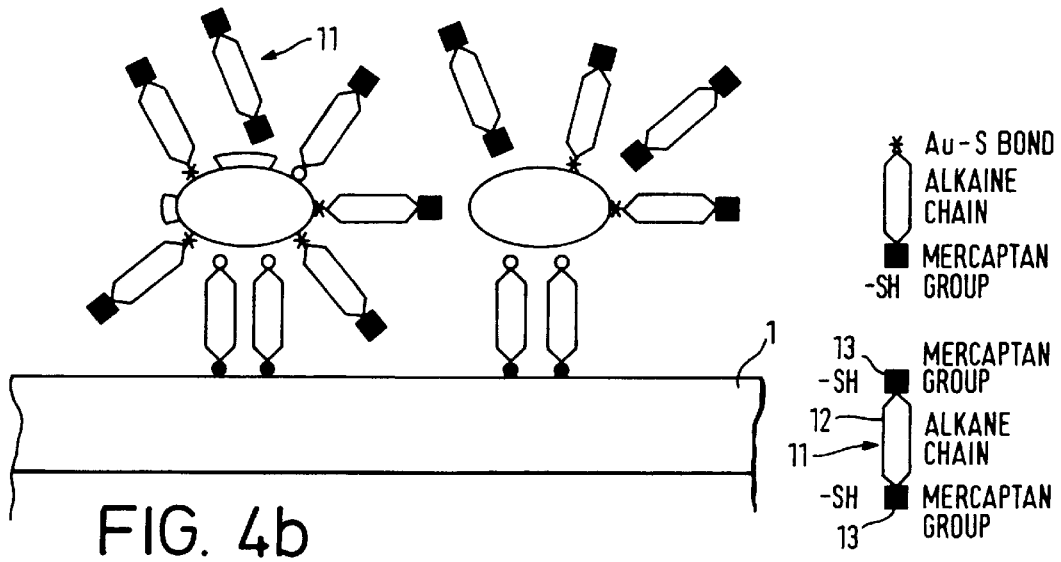

FIG. 4b illustrates the situation where the substrate is immersed in dithiol solution. The dithiol molecules 11 are illustrated schematically and consist of an alkane chain 12 terminated at each end by a mercaptan group—SH, referenced 13. The mercaptan groups exhibit a greater affinity to gold than the adsorbed citrate ions 5 and so become attached to the surface of each of the Au particles. Also, mercaptan groups have a greater affinity to gold than the amino groups 7 of the APTMS molecules 6 and as a result, the Au particles 3 become released from the $SiO_2$ layer 1.

Figure 4C:
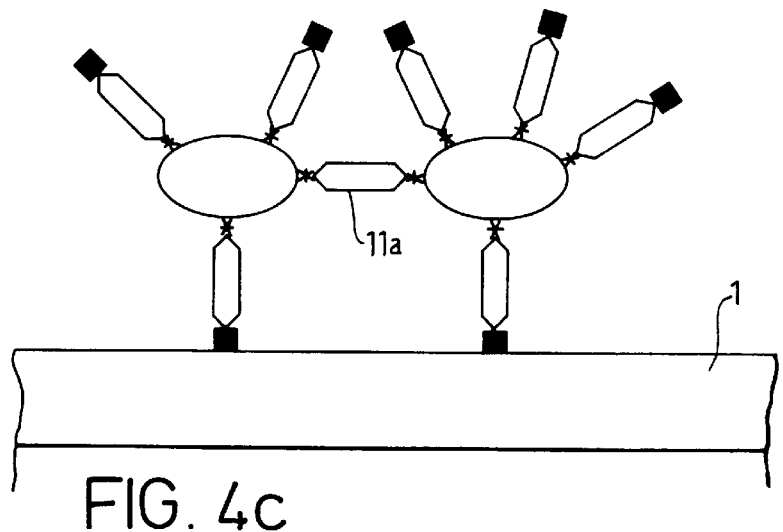

Referring now to FIG. 4c, the mobile Au particles 3 come in contact with one another and as a result, the free mercaptan groups 13 bond to the adjacent particles so as to lock them together. This is illustrated by the molecule 11a in FIG. 4c. Thus, in practice, the released Au particles 3 coalesce and build up into a greater mass. As a result, they loose their mobility. The resulting structure comprises a chain of Au particles 3 loosely bound by van der Waals forces to the substrate. The resulting chains can be used in single electron devices as explained in more detail hereinafter.

Practical examples of a single electron transistors which make use of these processes will now be described. Referring to FIG. 5, the first method of manufacturing a single electron transistor will be described. Referring to FIG. 5a, the substrate 2 has a 1 micron thick $SiO_2$ film 1 thermally grown on it, as previously described, which is overlaid by a PMMA mask 15 of thickness 100 nm. An elongate slit 16 was formed in the PMMA mask by conventional lithographic techniques so as to expose the $SiO_2$ insulating layer 1. The width w of the resulting trench was 30 nm.

Then, the substrate was treated as described previously, to provide a layer of APTMS 4 selectively within the trench. Then, a layer of gold particles was deposited on the APTMS coating 4 by the method previously described. Thus, the gold coating was only provided on the bottom of the trench. The gold particles 3 of the coating are clearly shown in the plan view of the substrate, in FIG. 5b.

Thereafter, the gold particle layer is treated with an alkanethiol. The submonolayer coated sample that corresponds to FIG. 5b is immersed in a 5 mM ethanolic solution of 1-dodecanethiol ($CH_3(CH_2)_{11}SH$), as an example of the alkanethiol, for 24 hours, and rinsed with an ethanol bath and dried with a nitrogen gun. The effect of the treatment is shown in FIG. 5c. The regularly spaced gold particles 3 shown in FIG. 3b are released from the APTMS layer 4 in the manner previously described with reference to FIG. 3. Longitudinal edges 17a, b of the trench 16 define surface irregularities against which the mobile gold particles 3 coalesce and aggregate into elongate wires running along the length of the side edges of the trench. Thus, the self-organisation of the particles 3 into chains is caused by the replacement reaction described with reference to FIG. 3 and the surface migration of the particles to the edge of the trench. In order to ensure that the particles form linear chains, the number of particles supplied in the trench during the monolayer deposition process needs to be controlled carefully. Additionally, the width of the trench should be less than 10 times the particle diameter. In this example, the trench width w is 30 nm and the particle diameter is 4 nm.

In order to strengthen the connection between adjacent particles in the chain, the structure may be additionally treated with dithiol after formation of the particle chains. This binds the particles covalently as described previously with reference to FIG. 4.

The resulting particle chains 19a, 19b can be used for active electron transport in a single electron transistor. To this end, electrode patterns are formed on the particle chains. Referring to FIG. 5d, the formation of the source 20, drain 21 and gate 22 electrodes will now be described. A two-layer resist system consisting of 40 nm thick 650,000 molecular weight polymethylmethacrylate (PMMA) and 60 nm thick 1,150,000 molecular weight PMMA was used for resist patterning. An 80 kV Electron beam was irradiated on the resist system and the irradiated resist was developed using 2-ethoxyethanol:methanol=3:7 mixture. Subsequently, vacuum evaporation was carried out to form a 5 nm thick Cr film as an adhesion layer, and a 20 nm thick Au film on top of the Cr layer. Afterwards, the metal films were lifted off by soaking the sample in an acetone for ~12 hours followed by an ultrasonic agitation, rinsed with isopropanol, and dried with a nitrogen gun. The metal electrode pattern is illustrated in plan view in FIG. 5d. The stripe electrodes were 30 nm wide and connected to bonding pads that are defined by photolithography. In FIG. 5d, "S", "G", and "D" designate source, gate and drain, respectively. The stripe electrode of source S and drain D are overlaid on the particle chain electrically-connecting the chain to the metal stripes, while the gate electrode G is not connected to the chain but is positioned at 30 nm away from the side edge of the trench or the chain. These elements constitute a single electron transistor (SET). Note that the electrode D is shared by the SETs with upper and lower source electrodes in this Figure. Four SETS are integrated in the structure shown in FIG. 5d.

Figure 6C:
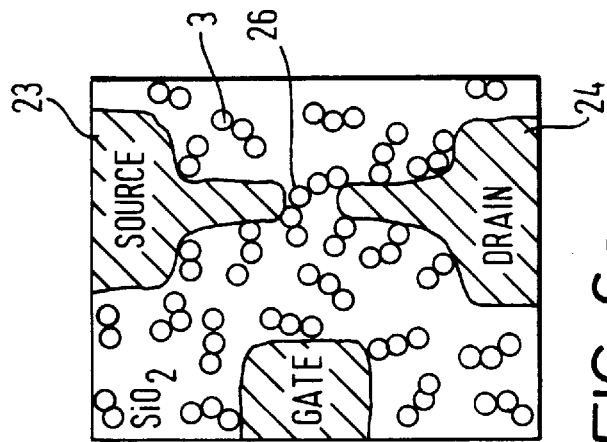
FIG. 6c illustrates the device of FIG. 6b after a replacement reaction which causes aggregation of the deposited Au particles.
Figure 6B:
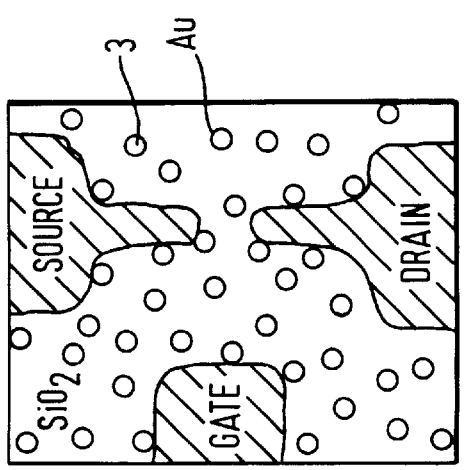
FIG. 6b illustrates the substrate of FIG. 6a, after the application of an Au particle monolayer.
Figure 6A:
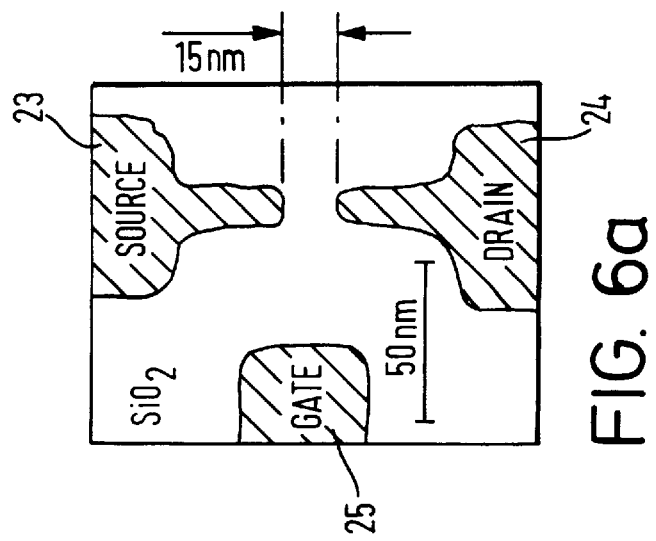
FIG. 6a illustrates a substrate for use in the manufacture of another device in accordance with the invention.

Another device according to the invention will now be described with reference to FIG. 6. As shown in FIG. 6a, source 23, drain 24 and gate 25 electrodes are formed on a layer of $SiO_2$, 200 nm thickness which is thermally grown on a Si substrate 1. The source, drain and gate electrodes are formed by conventional electron beam lithography techniques. The source 23 and drain 24 are spaced apart by 15 nm. A two-layer resist system consisting of 40 nm thickness 650,000 molecular weight PMMA and 60 nm thickness 1,150,000 molecular weight PMMA, was used for resist patterning in order to produce the electrodes. An 80 kv electron beam was directed onto the resist system and the irradiated resist was developed using 2-ethoxyethanol:methanol=3:7 mixture. Subsequently, vacuum evaporation was carried out to form a 5 nm thickness Cr film as an adhesion layer, followed by a 20 nm thickness Au film on top of the Cr layer. Afterwards the metal films were lifted off by soaking the sample in an acetone for ~12 hours followed by an ultrasonic agitation, rinsing with isopropanol and drying with a nitrogen gun. A plan view of the metal electrodes in the vicinity of the 15 nm gap is shown in FIG. 6a. The electrodes 23, 24, 25 are connected to bonding pads (not shown) defined by photolithography in a manner well known per se.

The sample with the electrode patterns as shown in FIG. 6a was cleaned by a brief (~30 seconds) oxygen plasma ashing. Afterwards, the APTMS treatment, followed by GCP solution immersion was carried out as previously described, to form a pattern of Au particles 3 in essentially a monolayer, as shown in FIG. 6b. The Au particles 3 were spaced apart in a generally regular spacing due to the electrostatic repulsion between the particles in the manner previously described with reference to FIGS. 1 and 2.

Then, the sample was treated using dithiols in order to induce particle chaining in the manner described with reference to FIG. 4. Since the particle chaining takes place over the entire substrate surface, the gap between source electrode 23 and drain electrode 24 can be bridged by one of the particle chains. This configuration is shown in FIG. 6c. Thus, particle chain 26 bridges the source and drain electrodes 23, 24. Electron transport through the particle chain 26 exhibits the Coulomb blockade effect and thus the device operates in the manner of a single electron transistor.

A number of modifications and variations to the described methods fall within the scope of the invention. For example, other colloidal particles other than Au can be used, such as, Ag, Pd, Pt, Ti, Cu, Cd, Hg, Al, Ni etc, metal oxides such as $SiO_2$, $Al_2O_3$, NiO, $TiO_2$, etc and also semiconductor particles such as Si, CdS, CdSe, etc.

Also, by attaching appropriate organic surfactants onto ligand-stabilised $Au_{55}$ clusters, a charge can be given to the clusters and the deposition method is also applicable to such cluster material. For formation of such material, reference is directed to Schön et al supra.

The silane coupling agent can be chosen from a variety of organo-silanes with different functional groups. For example, 3-aminopropyltrimethoxysilane and 3-[2-(2-aminoethylamino)ethylamino]propyl-trimethoxysilane can be used in almost the same way as the APTMS. Since the number of amino groups incorporated in those silane coupler molecules are different, they give slightly different interparticle distances reflecting the differences in the substrate surface charge induced by those amino groups in the silane coupler molecules. Also, the charge polarity can be changed by replacing the amino group with other groups such as a carboxyl group (—COOH) that dissociates in a water solution leaving a negative charge in the form of —COO$^-$. In this case, the charge polarity on the particles is changed accordingly.

Furthermore, the long chain n-alkanethiol ($HS(CH_2)_nX$, X=COOH, $CH_2NH_3$, etc) can also be used as the agent of particle substrate adhesion with an appropriate combination of substrate materials. These surfactant materials exhibit highly-ordered monolayer formation on an Au film deposited substrate surface. This is described in more detail in R. G. Nuzzo, L. H. Dubois, and D. L. Allara, J. Am. Chem. Soc., vol. 112, pp. 558–569 (1990). By choosing an appropriate functional group X as a tail group, it is possible to generate a surface charge in the similar way to the silane couplers.

What is claimed is:

1. A method of depositing nanometer scale particles having a mean diameter of less than 10 nm. on a substrate, comprising:

providing receptor sites of a first electrical polarity on a surface of the substrate, the particles having a surface charge of a second opposite polarity such that they are attracted to the receptor sites on the substrate, and releasing the particles from the receptor sites such that the particles move over the substrate and coalesce into an aggregated structure.

2. A method according to claim 1 including forming a mask pattern on the surface of the substrate to define a region including the receptor sites, the edge of the mask pattern providing a topographical irregularity, and the released particles aggregate at the irregularity.

3. A method according to claim 2 wherein the mask pattern defines an elongate trench with a width at least ten times greater than the mean diameter of the particles.

4. A method according to claim 1 wherein the particles in the aggregated structure become chemically bonded to one another.

5. A method according to claim 1 including treating the particles on the substrate with a fluid which includes a composition that bonds to the surface of the particles and releases them from said receptor sites.

6. A method according to claim 5 wherein the fluid includes a composition which chemically bonds together adjacent particles in the aggregated structure.

7. A method according to claim 6 wherein the composition comprises an alkanethiol.

8. A method according to claim 5 wherein the composition is selected from an alkanedithiol, aryldithiol and di-isonitrile.

9. A method according to claim 5 wherein the composition is applied to the substrate in an ethanolic solution.

10. A method according to claim 1 wherein the particles are deposited at said receptor sites at least substantially in a monolayer.

11. A method according to claim 1 wherein the particles are provided with surface adsorbed ions of said second polarity.

12. A method according to claim 11 wherein said adsorbed ions are citrate ions.

13. A method according to claim 1 wherein the particles are formed of a material selected from the group consisting of a metal and an oxide thereof.

14. A method according to claim 1 wherein the particles are formed of material selected from the group consisting of Au, Ag, Pd, Pt, Ti, Cu, Cd, Hg, Al, Ni, $SiO_2$, $Al_2O_3$, NiO and, $TiO_2$.

15. A method according to claim 1 wherein the particles are formed of a semiconductor.

16. A method according to claim 15 wherein the particles are formed of material selected from Si, CdS and CdSe.

17. A method according to claim 1 wherein the particles have a diameter of 2 nm +/−10%.

18. A method according to claim 1 including treating the surface of the substrate with a coupling agent to provide the receptor sites for the particles.

19. A method according to claim 18 wherein the substrate has an insulating surface and the coupling agent provides the receptor sites on the surface.

20. A method according to claim 18 wherein the substrate is made of silicon, with a $SiO_2$ layer that is treated with an organo-silane.

21. A method according to claim 20 wherein the organo-silane is an amino-functional silane.

22. A method according to claim 21 wherein the organo-silane is selected from the group consisting of:

3-(2-aminoethylamino)propyltrimethoxysilane, 3-aminopropyltrimethoxysilane, and

3-[2-(2-aminoethylamino)ethylamino] propyltrimethoxysilane.

23. A method according to claim 1 wherein the substrate is subjected to an aqueous suspension of said particles.

24. A method according to claim 18 including washing the substrate after treatment thereof with the coupling agent and before immersion thereof in an aqueous suspension of the particles.

25. A method of depositing nanometer scale particles having a mean diameter of less than 10 nm on a substrate, comprising:

providing receptor sites of a first electrical polarity on a surface of the substrate, the particles having a surface charge of a second opposite polarity such that they are attracted to the receptor sites on the substrate, and releasing the particles from the receptor sites such that the particles move over the substrate and coalesce into an aggregated structure wherein the substrate includes a topographical irregularity, and the released particles aggregate at the irregularity.

26. A method of depositing nanometer scale particles having a mean diameter of less than 10 nm on a substrate, comprising:

providing receptor sites of a first electrical polarity on a surface of the substrate, the particles having a surface charge of a second opposite polarity such that they are attracted to the receptor sites on the substrate, releasing the particles from the receptor sites such that the particles move over the substrate and coalesce into an aggregated structure, and treating the particles on the substrate with a fluid which reduces their surface charge and releases them from said receptor sites.

27. A method of depositing nanometer scale particles having a mean diameter of less than 10 nm on a substrate, comprising:

providing receptor sites of a first electrical polarity on a surface of the substrate, the particles having a surface charge of a second opposite polarity such that they are attracted to the surface receptor sites on the substrate, releasing the particles from the surface receptor sites such that the particles move over the substrate and coalesce into an aggregated structure, and providing electrodes on the substrate electrically coupled to the aggregated structure.

* * * * *